United States Patent [19]
Yamada

[11] Patent Number: 5,986,924
[45] Date of Patent: Nov. 16, 1999

[54] HIGH-SPEED STATIC RAM

[75] Inventor: Takashi Yamada, Tokyo, Japan

[73] Assignee: NEC Corporation, Tokyo, Japan

[21] Appl. No.: 09/103,721

[22] Filed: Jun. 24, 1998

[30] Foreign Application Priority Data

Jun. 25, 1997 [JP] Japan .................................. 9-169130

[51] Int. Cl.$^6$ ................................................. G11C 11/00
[52] U.S. Cl. ............................................ 365/154; 365/156
[58] Field of Search .................................... 365/154, 156, 365/189.09; 327/434

[56] References Cited

U.S. PATENT DOCUMENTS

| | | | |
|---|---|---|---|
| 4,805,148 | 2/1989 | Diehl-Nagle et al. | 365/156 |
| 5,523,966 | 6/1996 | Idel et al. | 365/156 |
| 5,559,892 | 9/1996 | Boor | 327/434 |
| 5,600,588 | 2/1997 | Kawashima | 365/156 |
| 5,621,693 | 4/1997 | Nakase | 365/156 |
| 5,706,226 | 1/1998 | Chan et al. | 365/156 |
| 5,726,562 | 3/1998 | Mizuno | 365/156 |

*Primary Examiner*—Trong Phan
*Attorney, Agent, or Firm*—Sughrue, Mion, Zinn, Macpeak & Seas, PLLC

[57] ABSTRACT

To provide a SRAM wherein high-speed and low-voltage operation can be achieved with a small and simple circuit configuration, in a memory cell of the SRAM comprising a pair of MOS driver transistors (23 and 24) and a pair of MOS access transistors (21 and 22), well potential of the MOS driver transistors (23 and 24) and the MOS access transistors (21 and 22) is controlled to be the same with potential of gate electrodes of the MOS access transistors (21 and 22) connected to a word line (WL0) for selecting said each of said memory cells.

8 Claims, 12 Drawing Sheets

5,986,924

HIGH-SPEED STATIC RAM

BACKGROUND OF THE INVENTION

The present invention relates to a SRAM (Static Random Acess Memory) having a high operational speed.

FIG. 9 is a circuit diagram illustrating a first conventional example of a memory cell configuration of the SRAM.

Referring to FIG. 9, the memory cell 200 has an inverter latch configured with a pair of nMOS (n-channel Metal Oxide Semiconductor) driver transistors 23 and 24 together with a pair of pMOS (p-channel MOS) load transistors 25 and 26. Each of a pair of memory terminals of the inverter latch is connected to each of a pair of bit lines D0 and $\overline{D0}$ though each of nMOS access transistors 21 and 22. Gates of the nMOS access transistors 21 and 22 are connected a word line WL0.

A plurality of memory cells having the same configuration with the memory cell 200 are arrayed in lateral and longitudinal directions of FIG. 9 sharing each word line laterally, and each pair of bit lines longitudinally.

Although not depicted in the drawing, a common well of the nMOS access transistors 21 and 22 and the nMOS driver transistors 23 and 24 is fixed to a ground voltage, and a common well of the pMOS load transistors 25 and 26 are fixed to a power supply voltage, in the same way with ordinary CMOS (Complementary MOS) cirucits.

When the memory cell 200 is selected, that is, the word line WL0 is turned to HIGH by a word driver 10, data latched in the inverter 25 latch is exchanged with outside by way of the nMOS access transistors 21 and 22 becoming ON through the pair of bit lines D0 and $\overline{D0}$, which means that the read/wirte speed of the memory cell 200 depends on the on-current of the nMOS access transistors 21 and 22. Therefore, in many conventional SRAMs, a boosted voltage Vpp higher than the power supply voltage is supplied to the word driver 10 in order to improve the read/write speed by raising the word line voltage to be supplied to gate terminals of the nMOS access transistors 21 and 22, such as shown in FIG. 10 illustrating a second conventional example of the memory cell configuration.

On the other hand, the on-current of the nMOS driver transistors 23 and 24 should be sufficiently large compared to the on-current of the nMOS access transistors 21 and 22, for stably maintaining latched status during reading operation of the memory cell 200. However, while the on-current of the nMOS access transistors 21 and 22 is increased in the second conventional example of FIG. 10 compared to the first conventional example of FIG. 9, the on-current of the nMOS driver transistors 23 and 24 is left to be the same. Therefore, the data maintenance stability is degraded in the second conventional example of FIG. 10.

Furthermore, the boosted voltage Vpp, which is usually generated by way of a charge pump circuit, for example, needs large capacitors, requiring considerable LSI chip areas.

FIG. 11 is a circuit diagram illustrating a third conventional example of the memory cell configuration, which is disclosed in a Japanese patent application laid open as a Provisional Publication No. 211079/'95.

In the third conventional example of FIG. 11, a back-bias supplier circuit 13 is provided for supplying a back-bias voltage to the wells of nMOS access transistors 21 and 22 and the nMOS driver transistors 23 and 24 of the memory cells. The back-bias supplier circuit 13 outputs either the ground voltage or a negative voltage (−2V, for example,) which is generated by a charge pump circuit.

Another characteristic of the memory cell 201 of FIG. 11 is that the transistors having low threshold voltage (0.4V, for example,) are applied there.

When the threshold voltage becomes low, the on-current of the MOS transistor becomes large, and, at the same time, the sub-threshold current, that is, the leak current flowing through the MOS transistor of OFF state, increses more sharply than the on-current. Therefore, a high-speed read/write operation is realized making use of the large on-current of the low threshold voltage MOS transistors, in the memory cell 201 of the third conventional example, and when the memory cell 201 is not in operation, the threshold voltage of the nMOS access transistors 21 and 22 and the nMOS driver transistors 23 and 24 is made high (0.9V, for example) by supplying the negative voltage to p-well thereof from the back-bias supplier circuit 13, for reducing the sub-threshold voltage flowing through them.

However, the negative voltage should be supplied to p-wells of all memory cells in the third conventional example of FIG. 11, while boosted voltage Vpp is sufficient to be supplied to a single selected word line. Therefore, a high power is needed for switching the SRAM from operation mode into non-operation mode, in the third conventional example of FIG. 11, together with a long time needed for mode switching, which restricts flexible switching into the non-operation mode.

Furthermore, the back-bias supplier circuit 13 should continue to generate the negative voltage during the non-operation mode of the SRAM, which counteracts a part of the effect of reducing the sub-threshold current.

FIG. 12 is a circuit diagram illustrating a fourth conventional example of the memory cell configuration disclosed in a Japanese patent application laid open as a Provisional Publication No. 296587/'95.

In this memory cell 202 of FIG. 12, source terminals of the nMOS driver transistors 23 and 24 are connected to a common source line Vss, and the well of the nMOS access transistors 21 and 22 and nMOS driver transistors 23 and 24 is connected to a ground line GND. Between the common source line Vss and the ground line GND, an nMOS transistor 36 and a high-resistance element 37 are connected in parallel.

Also in the memory cell 202, the low threshold voltage MOS transistors are used for the nMOS access transistors 21 and 22 and the nMOS driver transistors 23 and 24.

In the read/write operation, the nMOS transistor 36 is turned to ON by a chip enable signal CE supplied to its gate terminal. Therefore, the potential of the common source line Vss becomes the same with the potential of the ground line GND, and the nMOS access transistors 21 and 22 and the NMOS driver transistors 23 and 24 operate at high speed as ordinary low threshold voltage MOS transistors.

When the memory cell 202 is not in operation, the nMOS transistor 36 is controlled to be OFF, and the common source line Vss is connected to the ground line GND only through the high-resistance element 37. The unnecessary sub-threshold current leaking through the nMOS driver transistors 23 and 24 flows to the ground line GND through the high-resistance element 37. By the sub-threshold current flowing through the high-resistance element 37, the potential of the common source line Vss is made somewhat higher than the ground line GND. Therefore, the well potential of the nMOS driver transistors 23 and 24 is made substantially lower than potential of their source terminals, and makes their threshold voltage high, restricting the sub-threshold current.

However, for realizing the above high-speed operation, the nMOS transistor 36 should be large enough to give a sufficiently low on-resistance, and should have a sufficiently small sub-threshold current, at the same time.

As heretofore described, various devices have been disclosed for improving operational speed of the SRAM memory cell. However, there are problems left in the conventional examples.

A problem is increase of the number of circuit elements, such as charge pump circuits provided in the second and the third conventional examples of FIGS. 10 and 11, or the nMOS transistor 36 and the high-resistance element 37 for controlling standby current provided in the fourth conventional example of FIG. 12.

Another problem is increase of the chip size because of the additional elements, such as the large capacitors to be used in the charge pump circuits of the second and the third conventional examples, or the nMOS transistor 36, used for a chip enable switch in the fourth conventional example, which requires a considerably large chip space because it must shunt the high-resistance element 37 with very little voltage difference between its source terminal and drain terminal.

Another problem is intricacy of circuit designing, because precise consideration of characteristic dispersion of elements accompanying fabrication processes is to be required for designing analog circuits, such as the charge pump circuits of the second and the third conventional examples, or the standby current control circuit of the fourth conventional example.

Still another problem is the sub-threshold current still flowing through un-selected memory cells in the SRAMs of the third and the fourth conventional examples. The sub-threshold current of the nMOS access transistors may result in charge exchange between the bit-lines and the un-selected memory cells, without saying of the unnecessary power consumption. Usually, several hundreds to several thousands un-selected memory cells are connected to a pair of bit-lines. Therefore, the charge exchange of the un-selected memory cells may become not negligible compared to on-current of the selected memory cell. This means the reading speed of the SRAM varies depending on data pattern stored in the memory cells.

SUMMARY OF THE INVENTION

Therefore, a primary object of the present invention is to provide a SRAM wherein high-speed and low-voltage operation can be achieved with a small and simple circuit configuration.

In order to achieve the object, a memory cell of a SRAM according to the invention comprises a pair of MOS access transistors having a well which is controlled to have the same potential with gate electrodes of the MOS access transistors connected to a word line for selecting said each of said memory cells.

Therefore, when the memory cell is selected, the threshold voltage $V_{th}$ of the MOS access transistors becomes low, and the on-current of the MOS access transistors increases, enabling high-speed read/write operation of the memory cell.

The memory cell of the SRAM preferably comprises a pair of MOS driver transistors and a pair of MOS access transistors each connected to each of the pair of MOS driver transistors; wherein well potential of the MOS access transistors and the MOS driver transistors is controlled to be the same with potential of gate electrodes of the MOS access transistors connected to a word line for selecting said each of said memory cells.

Therefore, when the memory cell is selected, the threshold voltage $V_{th}$ of the MOS access transistors and the MOS driver transistors becomes low, and the on-current of the MOS access transistors and the MOS driver transistors increases at the same time, enabling high-speed read/write operation of the memory cell without degrading data maintenance stability of the memory cell.

When the SRAM is made of a bulk CMOS device, the MOS access transistors and the MOS driver transistors of memory cells controlled by two adjacent word lines are preferably configured on a common well, for economizing the chip size of the SRAM.

Further, the SRAM is preferably made of a full-depletion type SOI (Silicon-On-Insulator) device, wherein wells to be driven by the word line can be lmited to comparatively small back gates of the MOS access transistors and the MOS driver transistors, and there is no problem of leak current because of forward voltage of the PN junction.

Therefore, size increase of word line drivers can be also economized and the freedom of chip designing is enlarged in the SRAM made of the full-depletion type SOI device.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
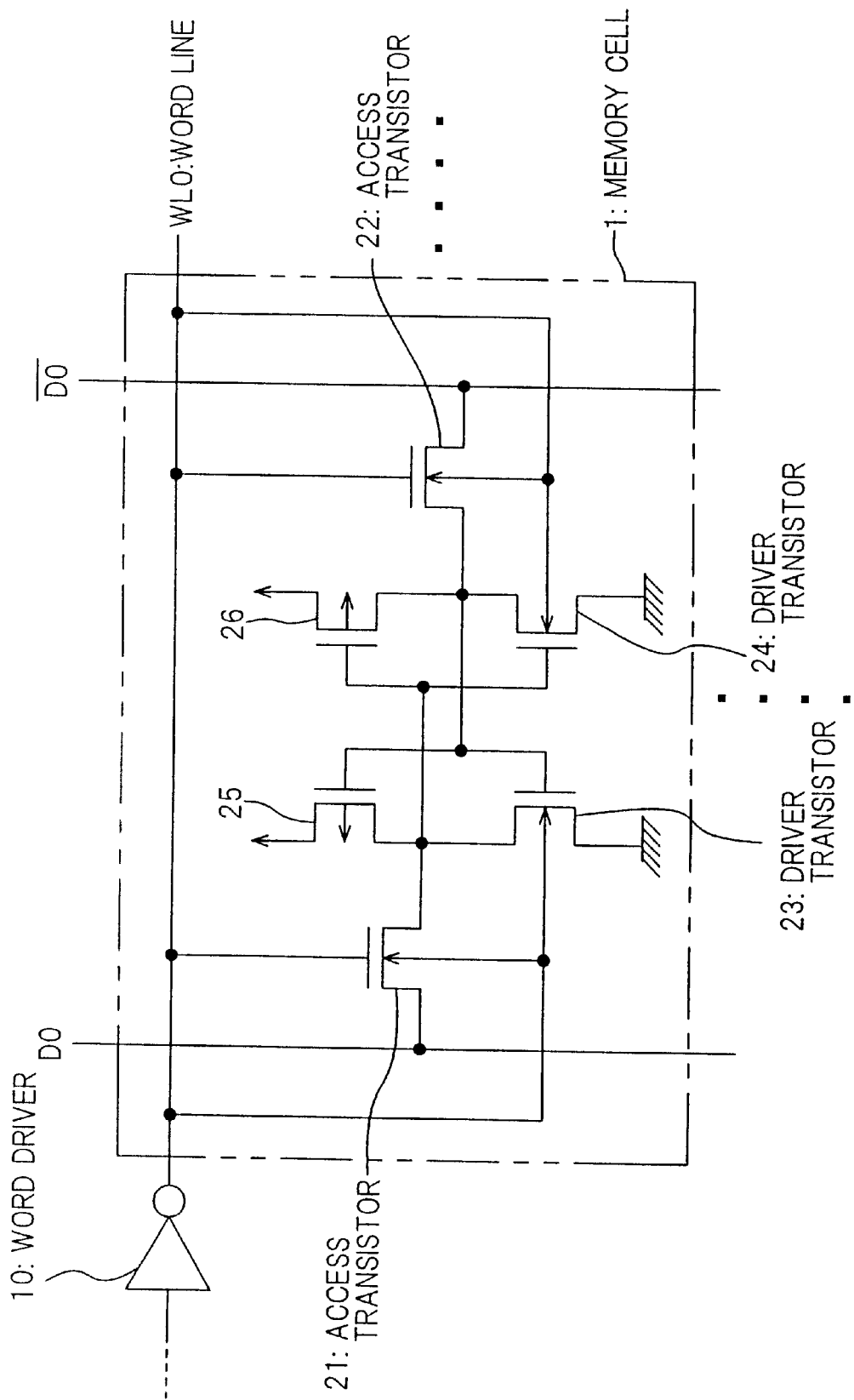
FIG. 1 is a circuit diagram illustrating a memory cell 1 according to a first embodiment of the invention.

FIG. 1 is a circuit diagram illustrating a memory cell 1 according to a first embodiment of the invention.

Figure 9:
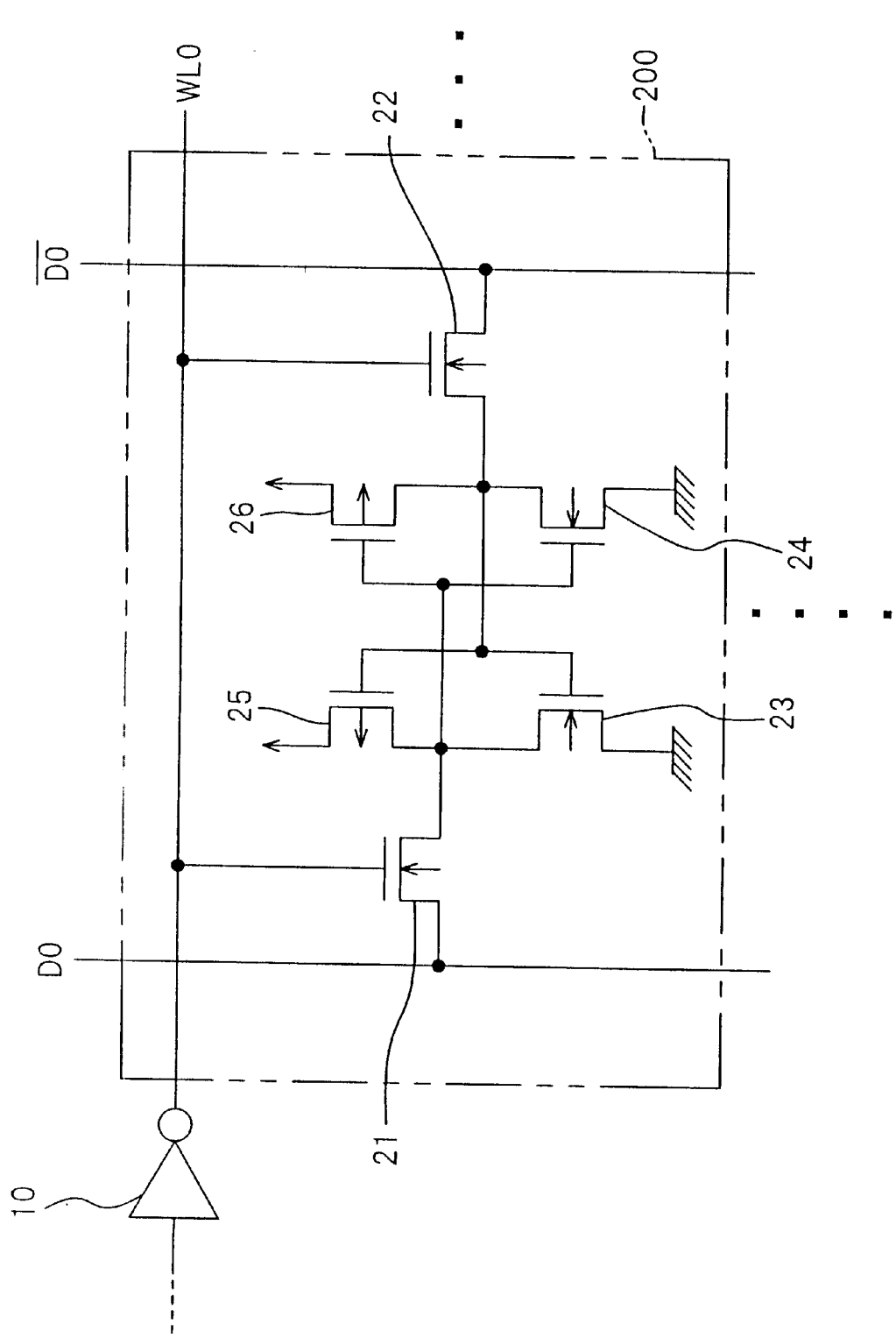
FIG. 9 is a circuit diagram illustrating a first conventional example of a memory cell configuration of the SRAM.
Figure 10:
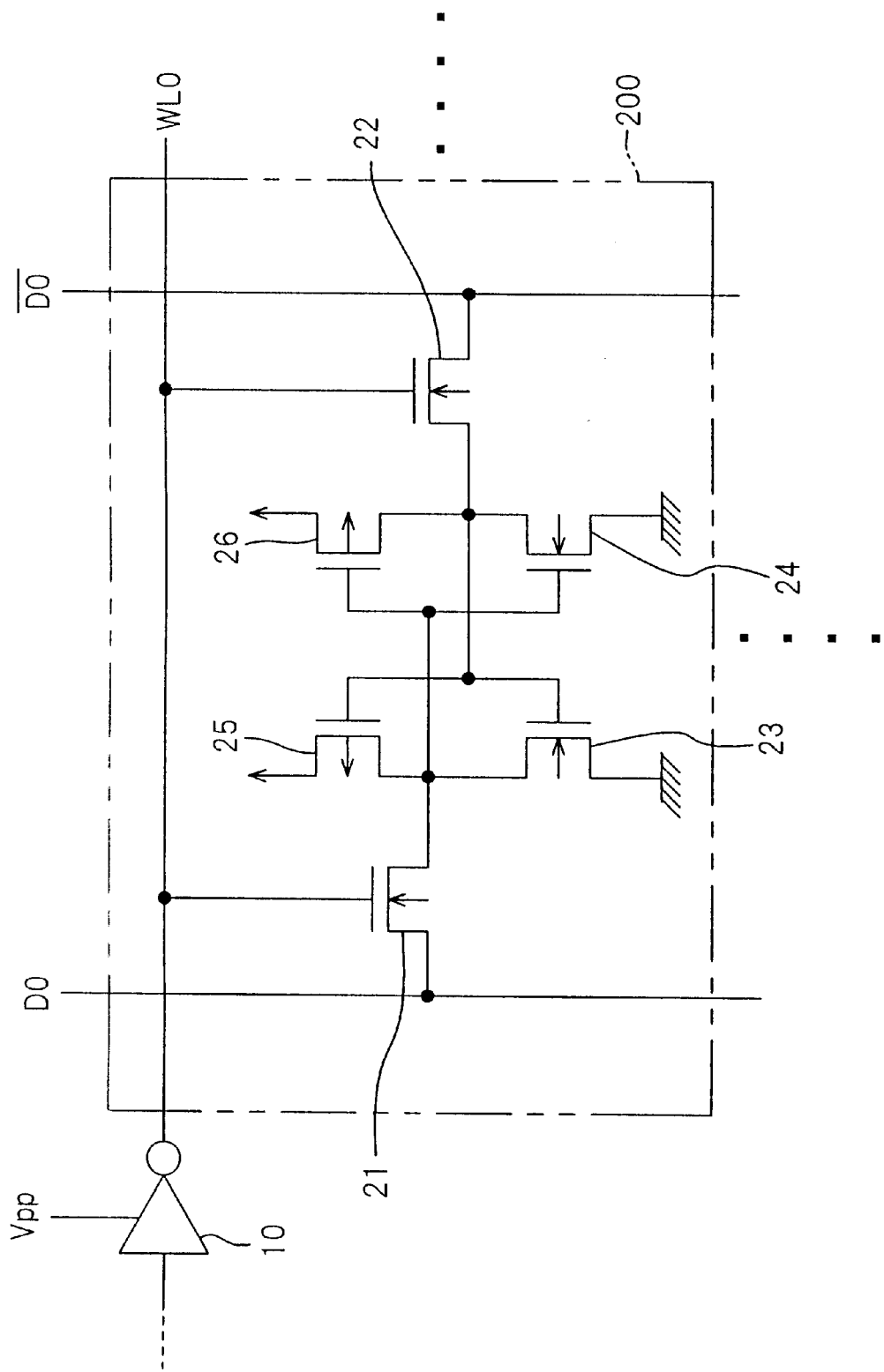
FIG. 10 is a circuit diagram illustrating a second conventional example of the memory cell configuration.
Figure 11:
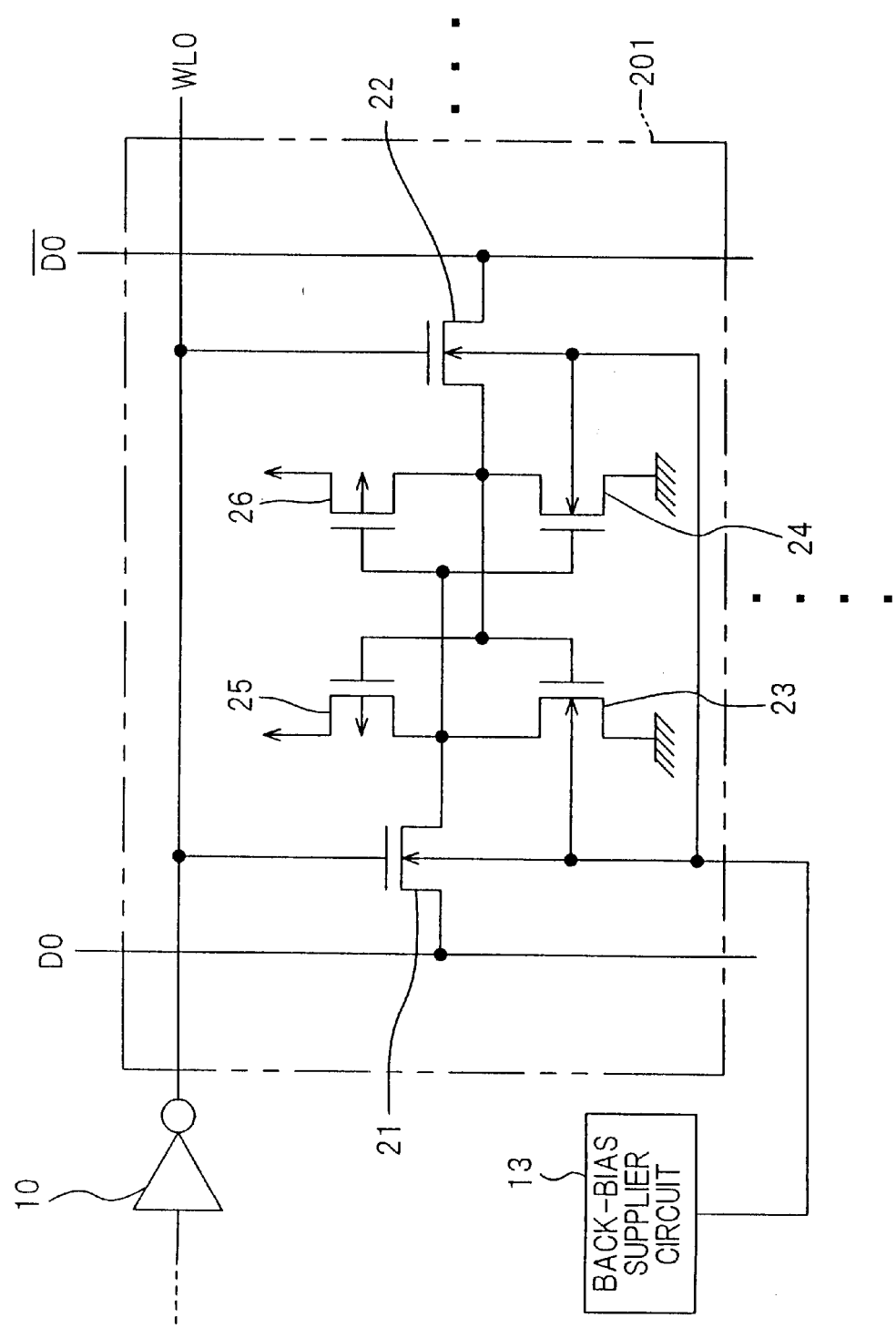
FIG. 11 is a circuit diagram illustrating a third conventional example of the memory cell configuration.
Figure 12:
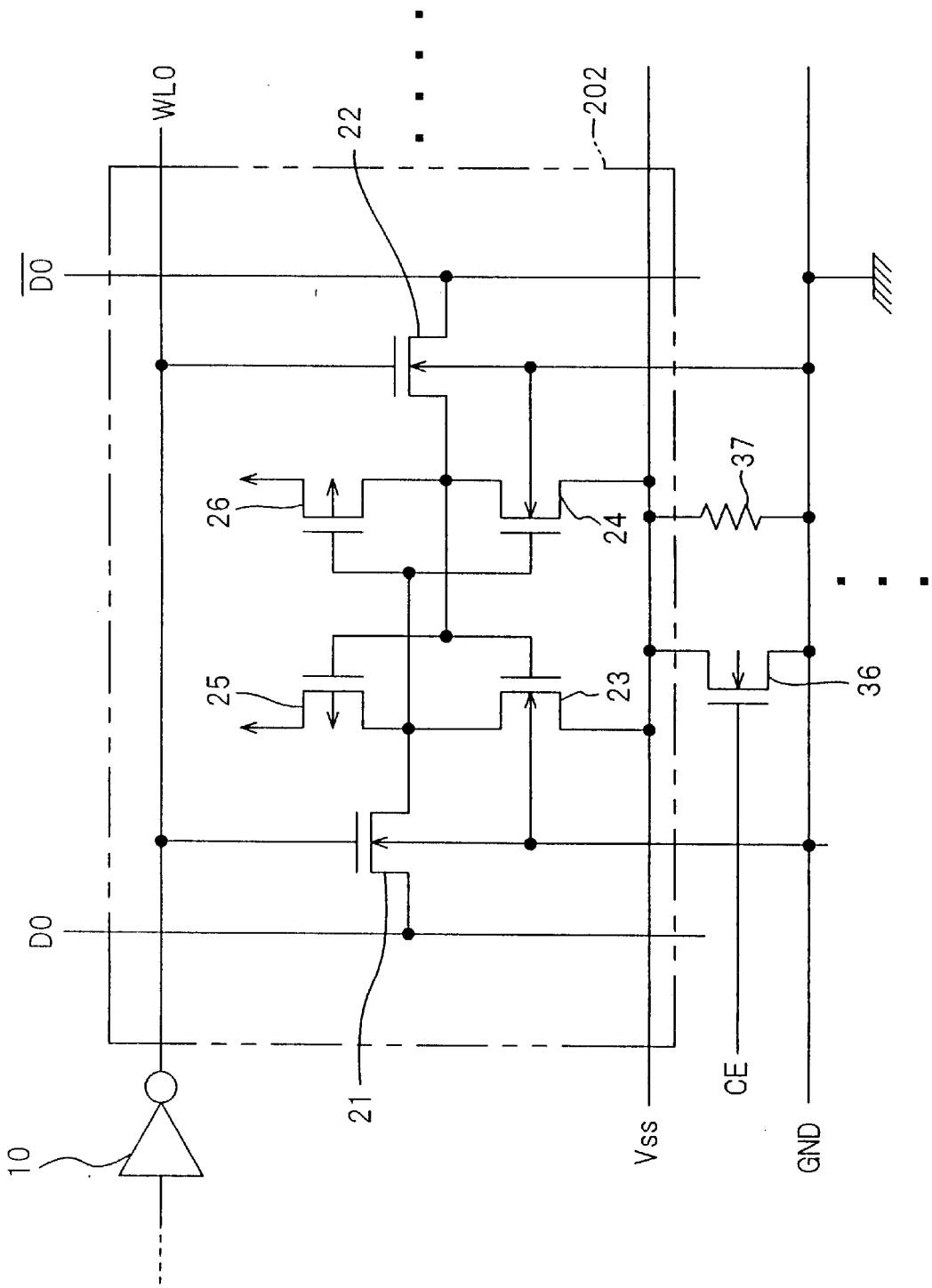
FIG. 12 is a circuit diagram illustrating a fourth conventional example of the memory cell configuration.

Similarly to the memory cell 200 of FIG. 9, the memory cell 1 of FIG. 1 has an inverter latch configured with a pair of nMOS driver transistors 23 and 24 together with a pair of pMOS load transistors 25 and 26. Each of a pair of memory terminals of the inverter latch is connected to each of a pair of bit lines D0 and $\overline{D0}$ though each of nMOS access transistors 21 and 22. Gate terminals of the nMOS access transistors 21 and 22 are connected to a word line WL0.

A plurality of memory cells having the same configuration with the memory cell 1 are arrayed in lateral and longitudinal directions of FIG. 1 sharing each word line laterally, and each pair of bit lines longitudinally.

The memory cell 1 of FIG. 1 is characterized in that a common well of the nMOS access transistors 21 and 22 and the pair of the nMOS transistors 23 and 24 are connected to the word line WL0. Now, operation of the memory cell of the first embodiment is described referring to FIG. 1.

In the same way with the conventional examples, the read/write of the memory cell 1 is performed by turning the potential of the word line WL0, that is, output of the word driver 10, to HIGH.

With potential of the word line WL0, potential of the common well of the nMOS access transistors 21 and 22 and the pair of the nMOS transistors 23 and 24, which is connected to the word line WL0, becomes HIGH.

When potential of p-well is raised, threshold voltage $V_{thN}$ of nMOS transistors configured on the p-well becomes low. Therefore, the read/write speed of the memory cell 1 is improved with increased on-current of the nMOS access transistors 21 and 22 whereof threshold voltage $V_{thN}$ is lowered when the memory cell 1 is accessed. Furthermore, as the on-current of the nMOS driver transistors 23 and 25 is increased simultaneously, there is no fear of degradation of the reading noise margin.

In consideration of application of the embodiment to all ordinary bulk CMOS devices, it should be noted that the p-well potential is raised to HIGH level of the word line WL0. If the p-well potential becomes higher than the forward voltage $V_f$ of the PN junction, leak current flowing to source electrodes or drain electrodes of the nMOS transistors occurs malfunction of the CMOS devices. Therefore, the power supply voltage should be designed to be within the forward voltage $V_f$, (0.5V, for example).

It is also to be noted that the word driver 10 of FIG. 1 requires a larger chip area than the word drivers of the conventional examples of FIGS. 9 to 12, for driving the well potential of the nMOS transistors of the memory cells sharing the word line. However, no additional circuit is needed to be designed for the first embodiment other than the conventional examples of FIGS. 9 and 10.

The operational speed of the SRAM depends on the on-current of the nMOS access transistors 21 and 22. Therefore, only the p-well of the nMOS transistors 21 and 22 may be connected to the word line WL0 for reducing loads of the word driver 10.

Figure 2:
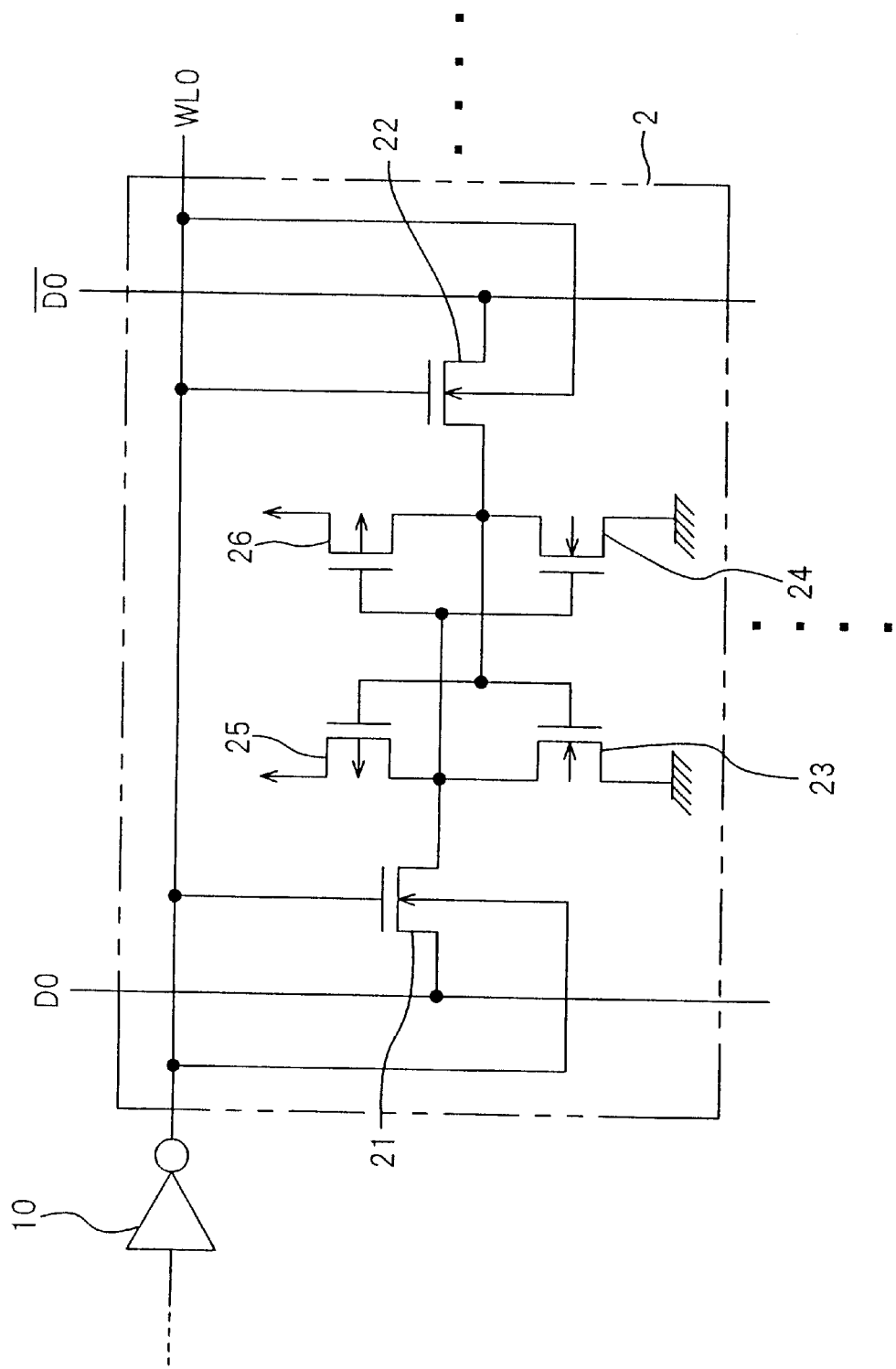
FIG. 2 is a circuit diagram illustrating a memory cell 2 according to a second embodiment of the invention.

FIG. 2 is a circuit diagram illustrating a memory cell 2 according to a second embodiment of the invention, wherein only the p-well of the nMOS access transistors 21 and 22 is connected to the word line WL0 for reducing load capacity of the word driver 10. However, the p-well of the nMOS access transistors 21 and 22 must be designed to be separated from the p-well of the nMOS driver transistors 23 and 24, when the second embodiment is applied to the bulk CMOS devices, which may increase the chip size of the memory cell array in total.

Figure 3:
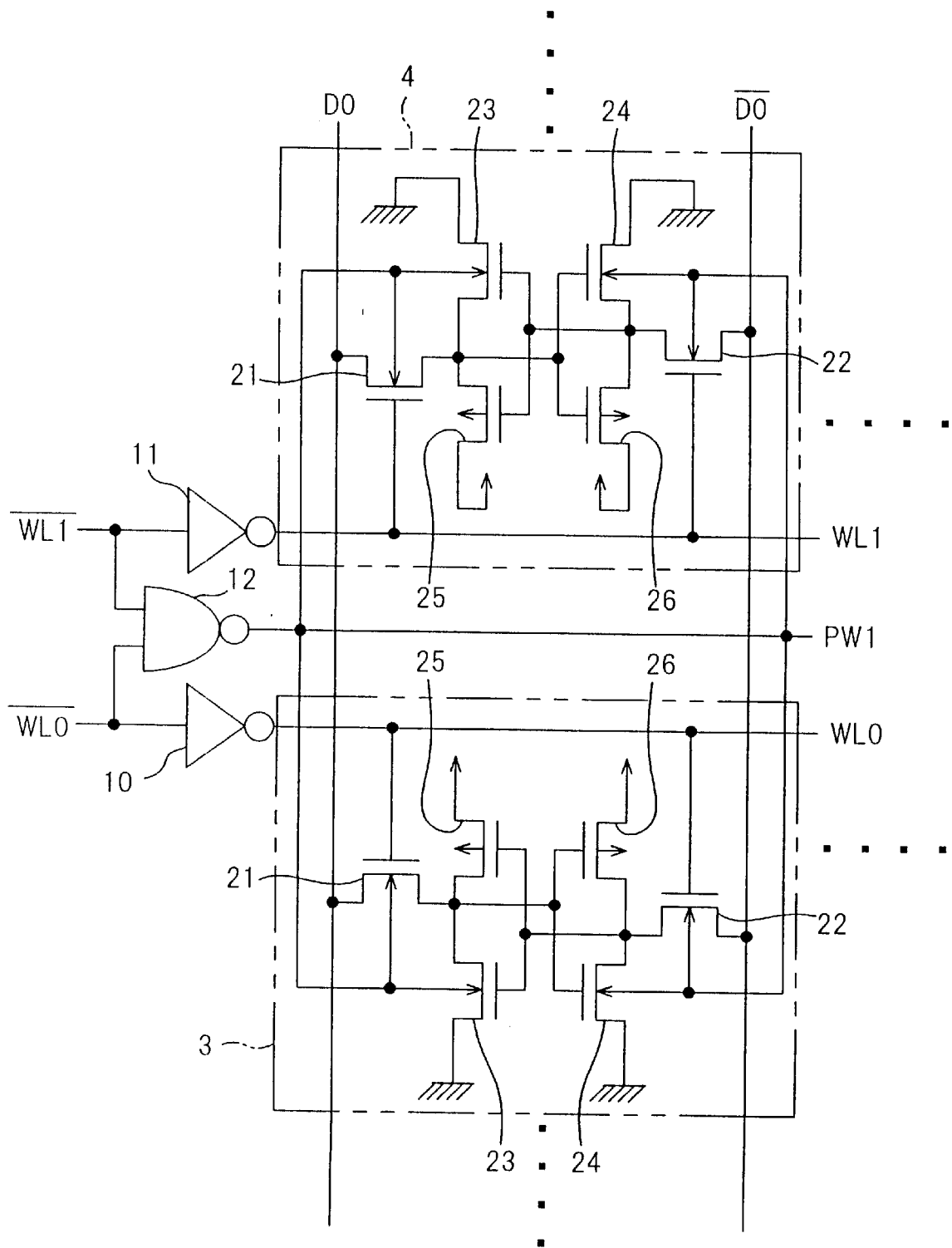
FIG. 3 is a circuit diagram illustrating a pair of memory cells 3 and 4 according to a third embodiment of the invention.

FIG. 3 is a circuit diagram illustrating a pair of memory cells 3 and 4 according to a third embodiment of the invention.

The p-well of the first or the second embodiment is driven by the word driver 10. However, the p-well of the third embodiment of FIG. 3 is driven by an output PW1 of a NAND gate 12. Two inputs of the NAND gate 12 are supplied with the same signals $\overline{WL0}$ and $\overline{WL1}$ to be supplied to the inverters functioning as the word drivers 10 and 11 for the memory cells 3 and 4. Therefore, the p-well of the memory cells 3 and 4 is turned to HIGH when either of the word line WL0 or the word line WL1 is enabled, and so, the chip size can be still reduced in the fourth embodiment than the first embodiment of FIG. 1, by sharing a single p-well with MOS access transistors and the MOS driver transistors of memory cells sharing every adjacent two word lines WL0 and WL1, when the fourth embodiment is applied to the bulk CMOS devices.

Heretofore, the present invention is described in connection with the memory cells 1 to 4 each comprising 6 transistors. However, it can be easily understood that the present invention can be applied in the same way also to a memory cell having 4 transistors.

Figure 4:
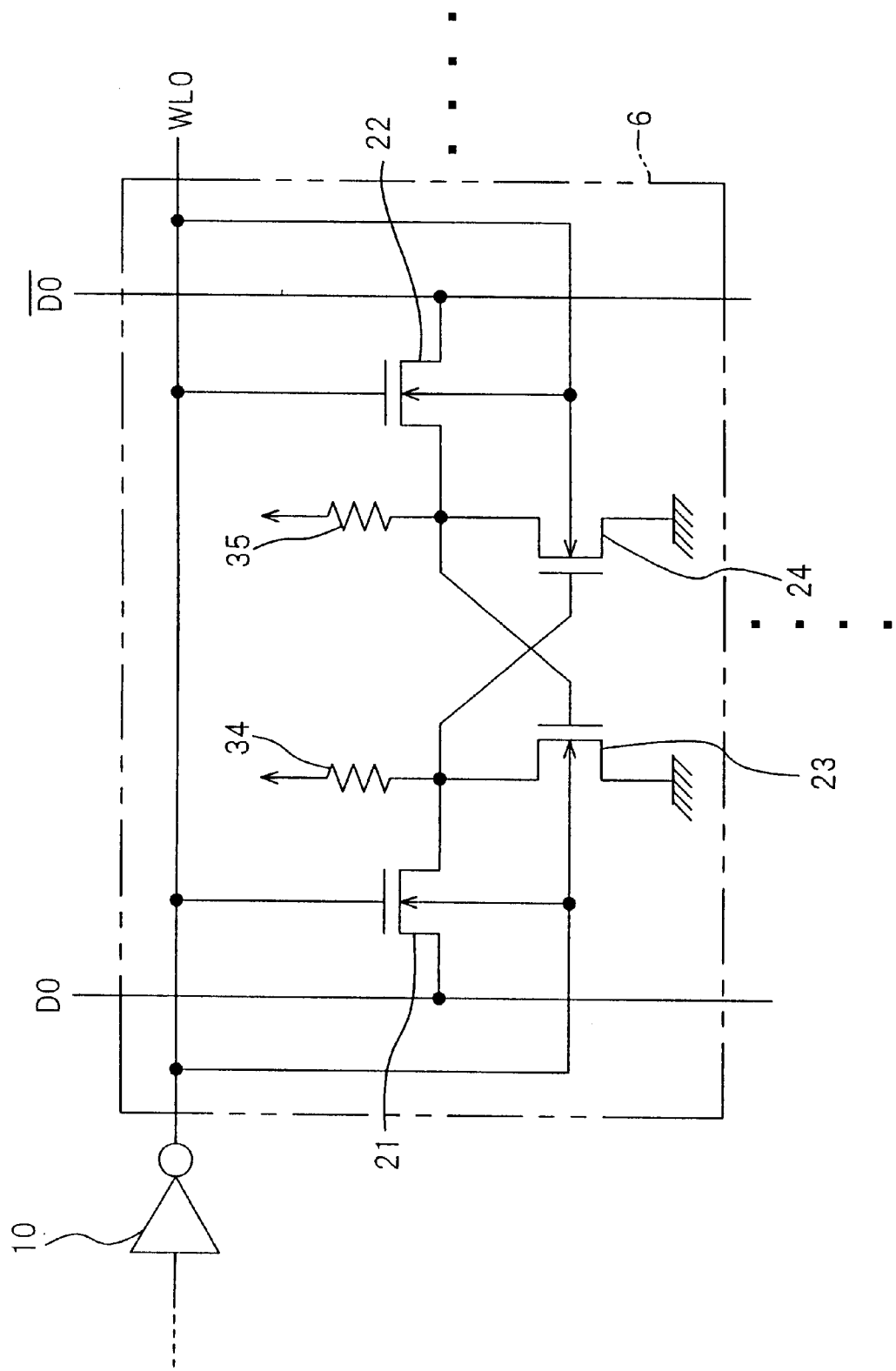
FIG. 4 is a circuit diagram illustrating a memory cell 5 according to a fourth embodiment of the invention.

FIG. 4 is a circuit diagram illustrating a memory cell 5 according to a fourth embodiment of the invention configured with two nMOS access transistors 21 and 22 and a pair of driver transistors 23 and 24, corresponding to the memory cell 1 of FIG. 1. The pair of PMOS load transistors 25 and 26 of FIG. 1 are replaced with a pair of load resistors 34 and 35.

In the memory cell 5 of FIG. 4, a common p-well for the nMOS access transistors 21 and 22 and the pair of driver transistors 23 and 24 is connected to the word line WL0, in the same way with the first embodiment of FIG. 1. However, only the p-well for the access transistors 21 and 22 may be driven by the word line WL0, or a single p-well may be shared with neighboring memory cells, in the same way with the second or the third embodiment, and the duplicated descriptions are omitted.

In the following paragraphs, some examples of the chip layout of the above embodiments will be described.

Figure 5:
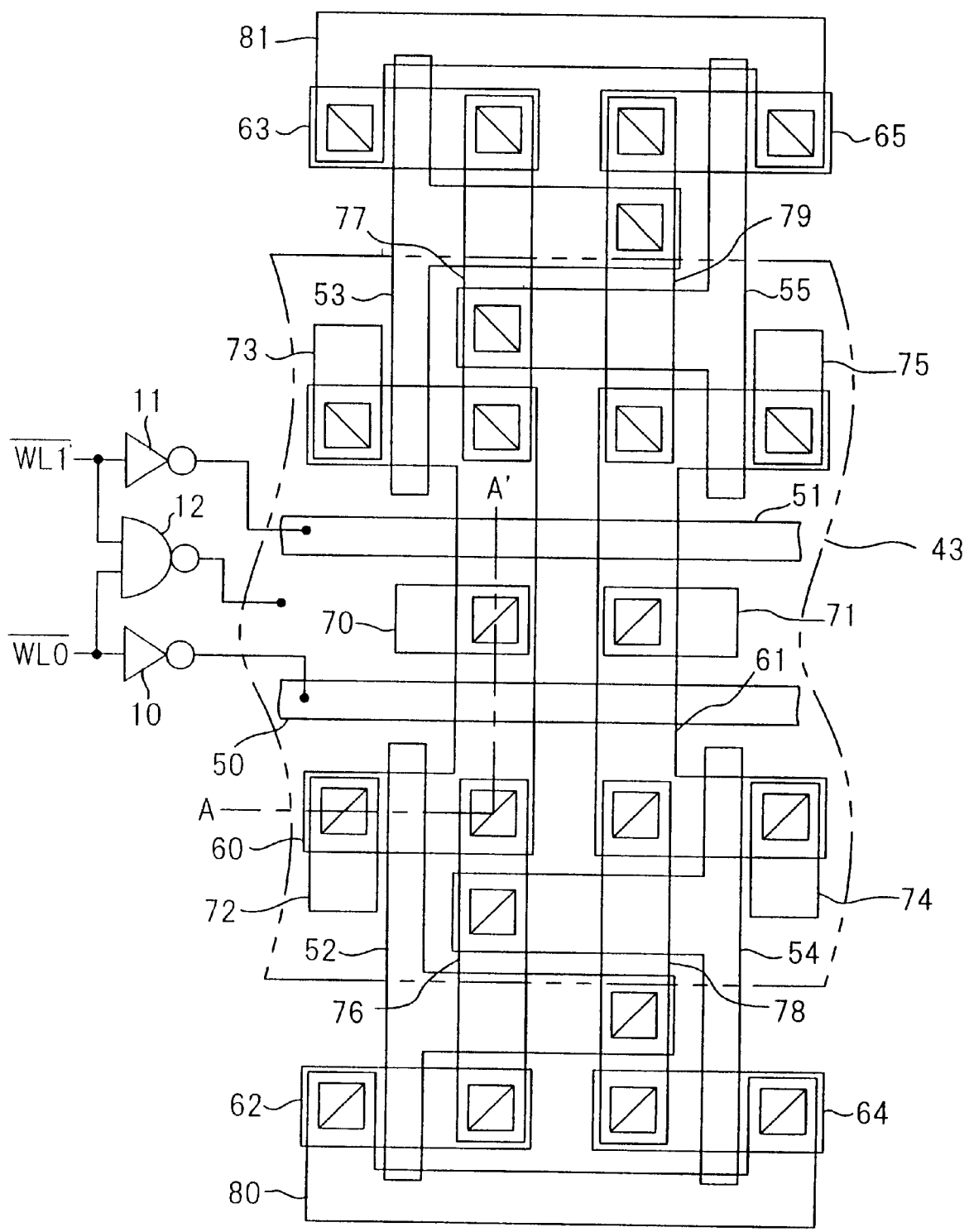
FIG. 5 is a plane figure illustrating a principal chip layout of the third embodiment of FIG. 3 applied to a bulk CMOS device.
Figure 6:
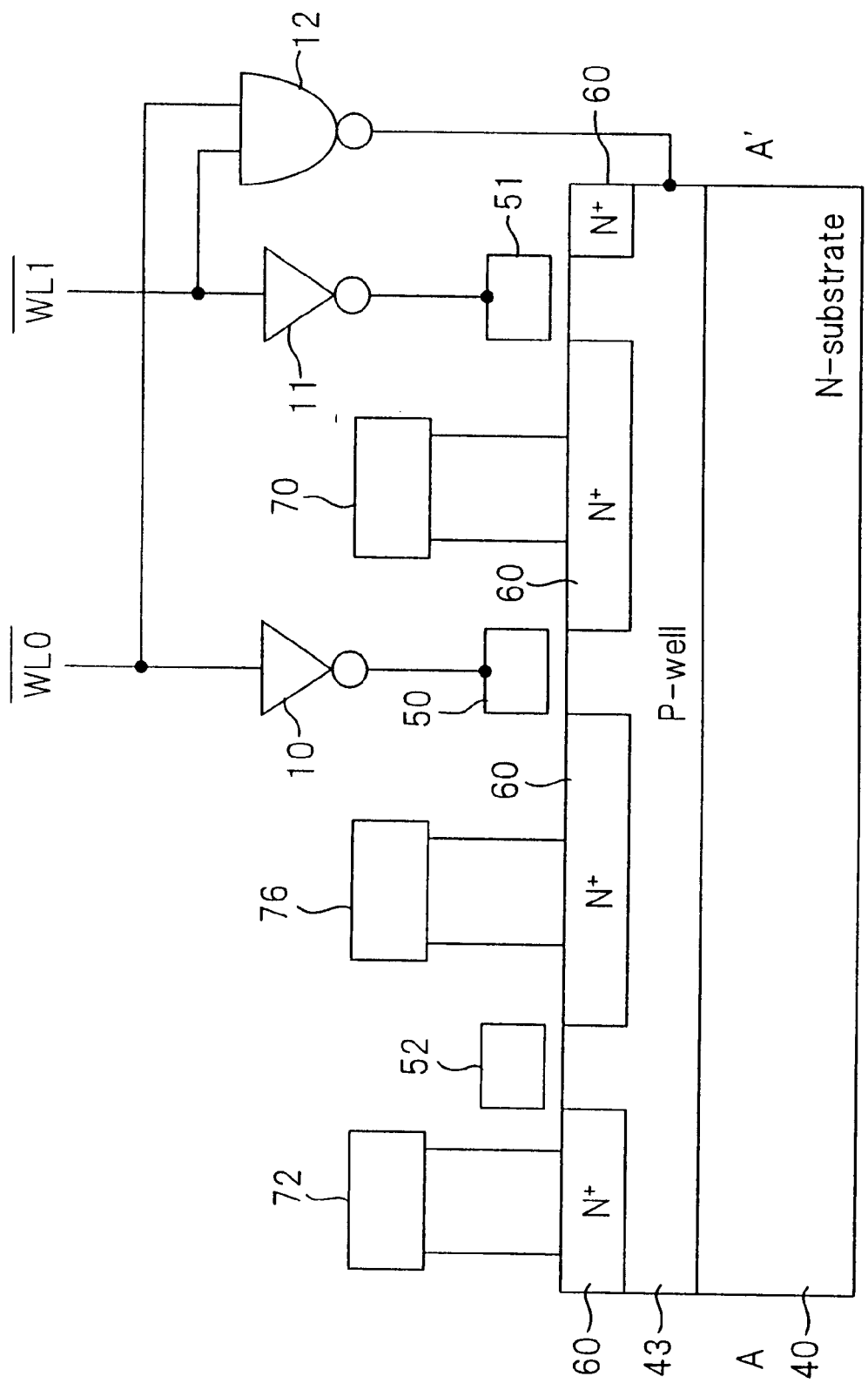
FIG. 6 is a schematic diagram illustrating a sectional view of the bulk CMOS device, cut along a line A—A' of FIG. 5.

FIG. 5 is a plane figure illustrating a principal chip layout of the third embodiment of FIG. 3 applied to a bulk CMOS device, and FIG. 6 is a schematic diagram illustrating a sectional view of the bulk CMOS device, cut along a line A—A' of FIG. 5.

Referring to FIGS. 5 and 6, on a common p-well 43 formed on an n-type substrate 40, diffusion layers 60 and 61 are configured for composing nMOS transistors. On n-wells formed outside of the common p-well 43, diffusion layers 62 to 65 are configured for composing pMOS transistors. On the diffusion layers 60 to 65, gate electrodes 50 to 55 are provided inserting gate insulation films between them. Metal wirings 70 to 81 are connected with contacts to each of the gate electrodes and the diffusion layers.

Comparing to the circuit diagram of FIG. 3, the gate electrodes 50 and 51 correspond to the word lines WL0 and WL1, respectively, the metal wirings 70 and 71 correspond to the bit lines D0 and $\overline{D0}$, respectively, the metal wirings 80 and 81 correspond to the power supply line, and the metal wirings 72 to 75 correspond to the ground line.

As previously described in connection with FIG. 3, the input signals $\overline{WL0}$ and $\overline{WL1}$ of the word driver 10 and 11 are also supplied to the NAND gate 12, whereof output is connected to the common p-well 43.

Thus, the third embodiment of FIG. 3 can be realized in a bulk CMOS device.

Figure 7:
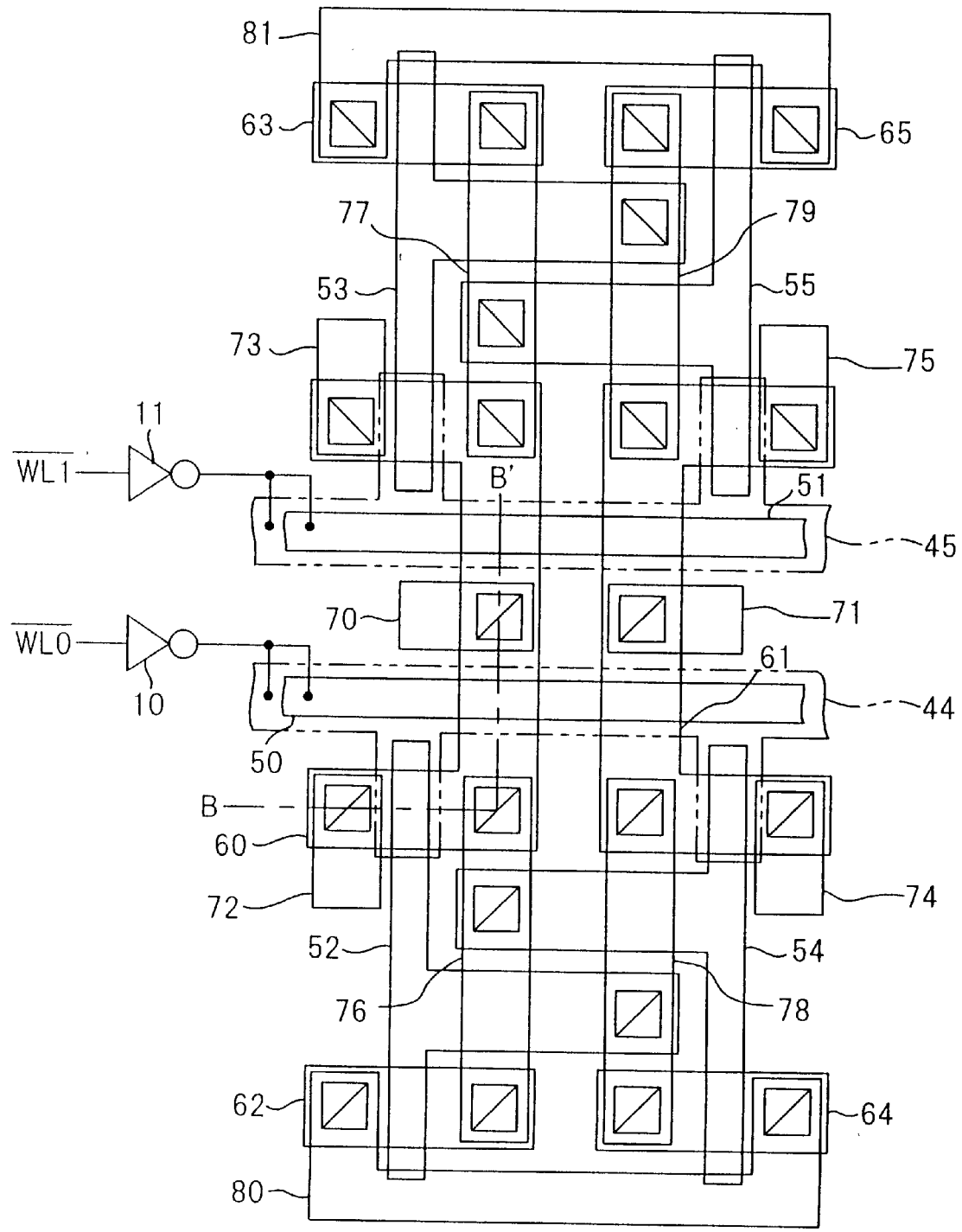
FIG. 7 is a plane figure illustrating a principal chip layout of the first embodiment of FIG. 1, applied to a full-deplethin type SOI device.
Figure 8:
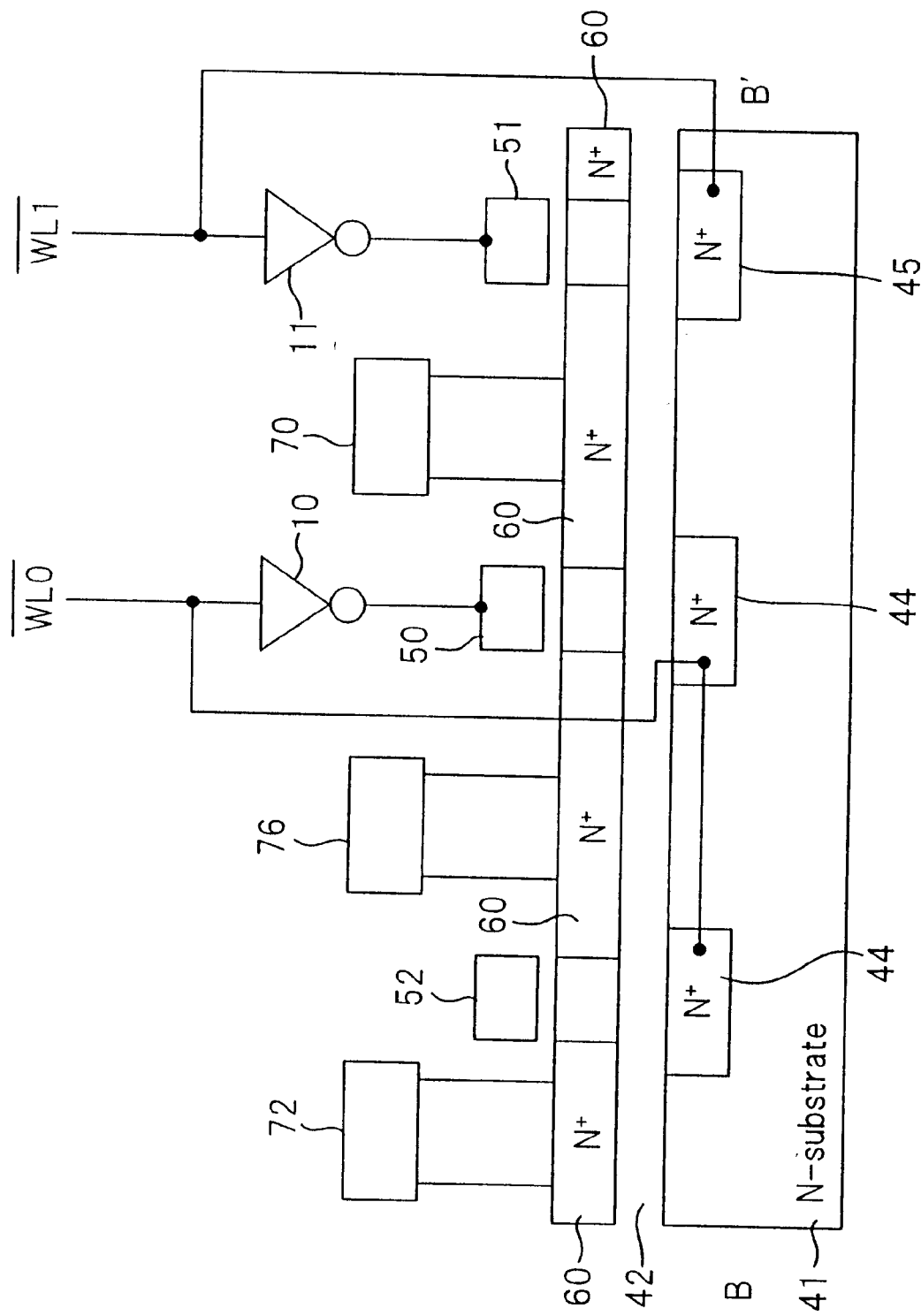
FIG. 8 is a schematic diagram illustrating a sectional view of the SOI device, cut along a line B—B' of FIG. 7.

The application of the present invention is not limited in the bulk CMOS device. FIG. 7 is a plane figure illustrating a principal chip layout of the first embodiment of FIG. 1, applied to a full-depletion type SOI (Silicon-On-Insulator) device, and FIG. 8 is a schematic diagram illustrating sectional view of the SOI device, cut along a line B—B' of FIG. 7. In the chip layout of FIG. 7, two memory cells according to the first embodiment are depicted to be driven with two word drivers 10 and 11, respectively.

Referring to FIGS. 5 and 6, on a buried insulation film 42 provided at upper surface of a p-type substrate 41, diffusion layers 60 to 65 are configured. The diffusion layers 60 and 61 compose nMOS transistors, and the diffusion layers 62 to 65 compose PMOS transistors. Gate electrodes 50 to 55 and metal wirings 70 to 81 are configured in the same way with corresponding those of FIG. 5, and duplicated descriptions are omitted.

On the surface of the p-substrate 41 interfacing to the insulation film 42, n-wells 44 and 45 are configured just under channels of corresponding nMOS transistors. The n-well 44 is connected to the word driver 10 together with the gate electrode 50 corresponding to the word line WL0, and the n-well 45 is connected to the word driver 11 together with the gate electrode 51 corresponding to the word line WL1.

As to the full-depletion type SOI device, the threshold voltage $V_{th}$ of MOS transistors can be controlled by changing potential of wells, so called back-gates, just under their channels. Therefore, read/write speed of the SRAM of the full-depletion type SOI device can be as well improved as that of the bulk CMOS device, with the chip layout of FIGS. 7 and 8, that is, with far small well size (44 and 45) to be driven than the well size (43) of the bulk CMOS device.

Therefore, comparatively small inverters can be used for the word drivers 10 and 11.

Furthermore, the back gates 44 and 45 being n-type semiconductors in the SOI devices, the leak current flowing out of the n-well back gates 44 and 45 into the p-substrate 41 remains very little, even when they are supplied with a high voltage (5V, for example).

Still further, the layout freedom of the back gates in the SOI device is larger than the layout freedom of the p-wells in the bulk CMOS, since the back gates are separated with the insulation film 42 from the diffusion layers in the SOI devices. Therefore, back gates can be easily configured separately without fear of leak current.

As heretofore described, operational speed of the SRAM can be improved according to the invention without increasing circuit elements, because the on-current of the access transistors can be increased without any additional circuit such as the charge pump, by driving the wells with ordinary word driver.

Further, the high-speed SRAM can be realized with minimum increase of the chip size, because no large size element such as the charge pump or the MOS switch (36 of the fourth conventional example) is needed.

Further, the high-speed SRAM can be easily designed without additional designing term, because the gate width of the word driver or the well driver is the only new matter to be considered.

Still further, in the high-speed SRAM of the invention, unnecessary sub-threshold current, such as the sub-threshold current derived in the third or the fourth conventional example, can be reduced even in operation, because the threshold voltage of the transistors concerning un-selected word lines remain high, enabling to economize power dissipation of the SRAM in operation.

What is claimed is:

1. A static RAM (Random Access Memory) device having a plurality of memory cells, each of said memory cells comprising a pair of MOS (Metal Oxide Semiconductor) access transistors; wherein a well potential of the MOS access transistors is the same as a gate electrode potential of the MOS access transistors connected to a word line for selecting said each of said memory cells.

2. A static RAM device having a plurality of memory cells, each of said memory cells comprising a pair of MOS driver transistors and a pair of MOS access transistors each of said access transistors connected to the pair of MOS driver transistors; wherein a well potential of the MOS access transistors and the MOS driver transistors is the same as a gate electrode potential of the MOS access transistors connected to a word line.

3. A static RAM device having a plurality of memory cells made of a CMOS (Complimentary MOS) device, each of said memory cells comprising a pair of MOS access transistors configured on a common well which is electrically connected to a word line for controlling the pair of MOS access transistors.

4. A static RAM device having a plurality of memory cells made of a CMOS device, each of said memory cells comprising a pair of MOS access transistors and a pair of MOS driver transistors configured on a common well which is electrically connected to a word line for controlling the pair of MOS access transistors.

5. A static RAM device having a plurality of memory cells made of a CMOS device, each of said memory cells comprising MOS access transistors configured on a common well and controlled by two adjacent word lines, wherein a potential of said common well is the same as a potential of one of the two adjacent word lines when said one of the two adjacent word lines is enabled and the potential of said common well is the same as a potential of the two adjacent word lines when none of the two adjacent word lines is enabled.

6. A static RAM having a plurality of memory cells made of a CMOS device, each of said memory cells comprising MOS access transistors configured on a common well with MOS driver transistors and said MOS access transistors being controlled by two adjacent word lines, wherein a potential of said common well is the same as a potential of one of the two adjacent word lines when said one of the two adjacent word lines is enabled and wherein said potential of said common well is the same as a potential of said two adjacent word lines when none of the two adjacent word lines is enabled.

7. A static RAM having a plurality of memory cells made of a SOI (Silicon-On-Insulator) device, each of said memory cells comprising a pair of MOS access transistors having back gates electrically connected with gate electrodes of the pair of MOS access transistors such that a potential of said back gates of said access transistors is the same as a potential of said gate electrodes of said access transistors.

8. A static RAM having a plurality of memory cells made of a SOI device, each of said memory cells comprising a pair of MOS access transistors and a pair of MOS driver transistors both of said pair of MOS access transistors and said pair of driver transistors having back gates electrically connected with gate electrodes of the pair of MOS access transistors such that a potential of said back gates of said access and driver transistors is the same as a potential of said gate electrodes of said access transistors.

* * * * *